(12) United States Patent
Spangler et al.

(10) Patent No.: US 11,833,815 B2
(45) Date of Patent: Dec. 5, 2023

(54) COATINGS FOR OPTICAL DROP DETECTORS

(71) Applicant: Hewlett-Packard Development Company, L.P., Spring, TX (US)

(72) Inventors: Jordan David Spangler, Corvallis, OR (US); Eric Thomas Martin, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 96 days.

(21) Appl. No.: 17/416,544

(22) PCT Filed: Jun. 8, 2019

(86) PCT No.: PCT/US2019/036186
§ 371 (c)(1),
(2) Date: Jun. 21, 2021

(87) PCT Pub. No.: WO2020/251517
PCT Pub. Date: Dec. 17, 2020

(65) Prior Publication Data
US 2022/0097366 A1 Mar. 31, 2022

(51) Int. Cl.
*B41J 2/045* (2006.01)
*G01N 9/00* (2006.01)

(52) U.S. Cl.
CPC ....... *B41J 2/04558* (2013.01); *B41J 2/04586* (2013.01); *G01N 9/00* (2013.01)

(58) Field of Classification Search
CPC .......................... B41J 2/04558; B41J 2/04561
See application file for complete search history.

(56) References Cited

U.S. PATENT DOCUMENTS

| 6,252,237 B1 * | 6/2001 | Ramthun ........... G01B 11/0658 |
| | | 250/559.27 |
| 2009/0058921 A1 | 3/2009 | Habashi |
| 2009/0153486 A1 * | 6/2009 | Bohn .................... G06F 3/0317 |
| | | 345/166 |

(Continued)

FOREIGN PATENT DOCUMENTS

| CN | 105226127 | 1/2016 |
| CN | 105842171 A | 8/2016 |

(Continued)

OTHER PUBLICATIONS

Xue Zhou, Xuegang Li, TongLei Cheng, Shuguang Li, Guowen An; "Graphene Enhanced Optical Fiber SPR Sensor for Liquid Concentration Measurement"; Optical Fiber Technology, 43 (2018), 62-66.

*Primary Examiner* — Scott A Richmond

(57) ABSTRACT

An example of an apparatus is provided. The apparatus includes a printhead to dispense drops of print fluid on a media. The drops are to travel along a drop path through air from the printhead. In addition, the apparatus includes a light source to emit light across the drop path. The apparatus also includes a detector to detect an intensity of the light received from the light source. The drop path is to intersect an optical path from the light source to the detector. Furthermore, the apparatus includes a coating disposed on the optical path between the drop path and the detector. The coating is to absorb a threshold amount of the light.

11 Claims, 6 Drawing Sheets

(56) References Cited

U.S. PATENT DOCUMENTS

| | | | |
|---|---|---|---|
| 2009/0184993 A1 | 7/2009 | Yorimoto et al. | |
| 2010/0259753 A1 | 10/2010 | Shepherd et al. | |
| 2014/0098156 A1* | 4/2014 | Taff | B41J 2/04561 |
| | | | 347/19 |
| 2015/0364614 A1 | 12/2015 | Withers et al. | |
| 2017/0181669 A1 | 6/2017 | Lin et al. | |
| 2018/0001626 A1 | 1/2018 | Franzoso et al. | |

FOREIGN PATENT DOCUMENTS

| | | |
|---|---|---|
| CN | 107206786 A | 9/2017 |
| DE | 60032285 | 4/2007 |
| JP | 2002-520606 A | 7/2002 |
| JP | 2006-150637 A | 6/2006 |
| JP | 2007-118264 A | 5/2007 |
| JP | 2007-296670 A | 11/2007 |
| JP | 2011-093155 A | 5/2011 |
| JP | 2012-187274 A | 10/2012 |
| JP | 5937006 | 6/2016 |
| WO | WO-2012166119 A1 | 12/2012 |

\* cited by examiner

COATINGS FOR OPTICAL DROP DETECTORS

BACKGROUND

Printing devices are often used to present information. In particular, printing devices may be used to generate output that may be easily handled and viewed or read by users. Accordingly, the generation of output from printing devices from electronic form is used for the presentation and handling of information. Some printing devices use print fluids to generate output. In such printing devices, the print fluids are generally applied to a medium.

BRIEF DESCRIPTION OF THE DRAWINGS

Reference will now be made, by way of example only, to the accompanying drawings in which.

DETAILED DESCRIPTION

Some printing devices use fluids to generate output. For example, printing devices may generate documents, images, or three-dimensional objects. In such printing devices, fluid delivery systems are generally used to deliver a liquid from one part of the printing device, such as a reservoir to a printhead where the fluid is subsequently ejected through a nozzle onto a media, such as paper, to generate an image. Over time, the health of the nozzle degrades. For example, the nozzle health may degrade and become less responsive or completely inoperable due to mechanical degradation. In other examples, the nozzle health may degrade due to a build-up of deposits around the nozzle, such as dried print fluid and/or dirt.

To monitor and/or validate the health of a nozzle on a printhead, a printing device may use an optical drop detection system. During such a process, the optical drop detection system may dispense or eject drops from the nozzle. The drops may pass through a beam of light and a detector may be used to determine the characteristics of the print fluid, such as the amount of drops of the print fluid, the size and shape of the drops of the print fluid, and/or the trajectory of the print fluid, passing through the beam of light and thus infer the health of the nozzle. For example, the amount of drops passing through the beam of light may provide a small change in signal level at the detector when the relative density of the drops changes significantly. Accordingly, it may be difficult to accurately determine a quantity of ejected drops or drop density to use for validating the health of a nozzle.

In general, an optical drop detection process is to be carried out over a receptacle where each nozzle of the printhead is to eject a small burst of drops. For example, a healthy nozzle may eject about eight to twenty drops or about 3-10 pL, whereas an unhealthy nozzle may eject no drops or a few drops during a test procedure.

In the examples described below, a coating capable of absorbing photons is applied to the detector of the optical drop detection system. The coating may be used to increase the signal to noise ratio of optical drop detection systems by using a saturable absorption phenomenon. Accordingly, by tuning the coating to absorb a specific amount of photons representing a specific level of illumination, the coating may improve the signal to noise ratio near the threshold intensity used to determine if a nozzle is to be considered healthy.

As used herein, any usage of terms that suggest an absolute orientation (e.g. "top", "bottom", "vertical", "horizontal", etc.) are for illustrative convenience and refer to the orientation shown in a particular figure. However, such terms are not to be construed in a limiting sense as it is contemplated that various components will, in practice, be utilized in orientations that are the same as, or different than those described or shown.

Figure 1:
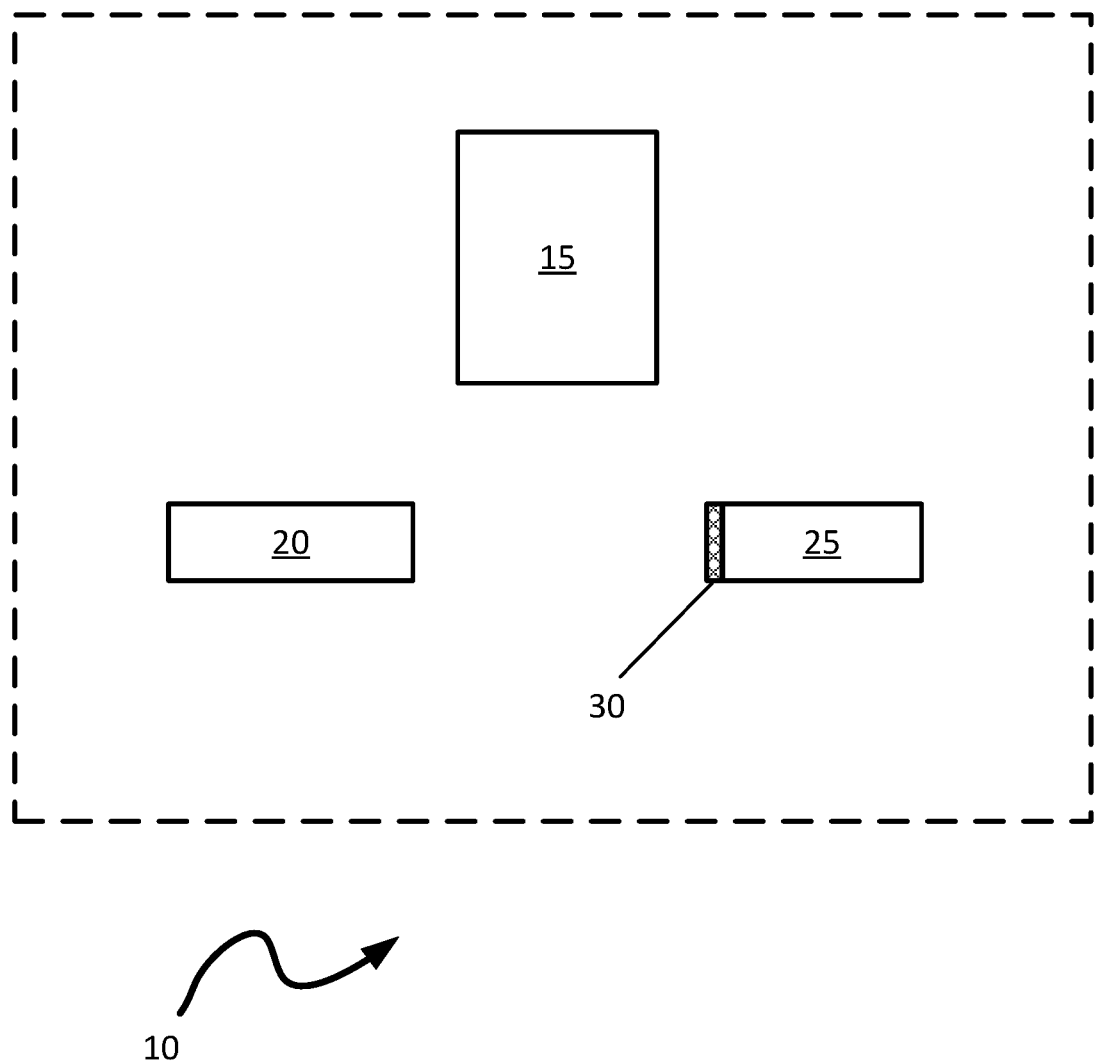
FIG. 1 is a schematic representation of an example apparatus to monitor the health of a nozzle.

Referring to FIG. 1, an apparatus to monitor the health of a nozzle is generally shown at 10. The apparatus 10 may be part of a printing device or a separate component to operate on or with the printing device to monitor the health of a nozzle. For example, the apparatus 10 may be attached proximate to a printhead to measure the health of nozzles on the printhead. The apparatus 10 may include additional components, such as various controllers, and additional interfaces or displays to interact with a user or administrator. In other examples, the apparatus 10 may be integrated with the printing device such that interfaces and controllers are managed by the printing device or another computing device. Furthermore, in some examples, the apparatus 10 may be used to monitor nozzle health during the printing process. In other examples, the apparatus 10 may be used away from any media, such as into a waste receptacle. In the present example, the apparatus 10 includes a printhead 15, a light source 20, a detector 25, and a coating 30.

The printhead 15 is to dispense drops of print fluid in general, for example onto media. The manner by which the printhead 15 dispenses drops is not limited. In the present example, the printhead 15 may eject drops of print fluid under pressure such that the drops travel along a drop path from the printhead 15 through the air. The source of the print fluid provided to the printhead 15 is also not limited. For example, the printhead 15 may receive print fluid from a tank, reservoir, or other print fluid source. For example, the printhead 15 may include a motor and/or vacuum to draw the print fluid via a fluid line. In other examples, the printhead 15 may use capillary action to draw the print fluid. In further examples, the printhead 15 may include a tank such that the print fluid is delivered to the printhead 15 by gravity. In some examples, the printhead 15 may include multiple sources of print fluid where each source of print fluid may provide a different print fluid. For example, the printing device may have separate tanks of print fluid for different colors, such as black, cyan, magenta, and yellow. The print fluid from each source may be directed to different nozzles on the printhead 15. Accordingly, during a printing operation, the printhead 15 may dispense a mixture of different colors to deposit on the media depending on the output image.

In some examples, the printhead 15 may also include various control components such as a controller or microprocessor. The controller or microprocessor may receive electrical signals corresponding to a print job. The printhead 15 may then coordinate nozzles to dispense the print fluid onto media to generate an image or document. As discussed above, the control components may also be used to control the apparatus 10 and/or other systems for detecting or maintaining the health of the nozzles on the printhead 15.

The light source 20 is to emit light across the drop path along which the drops from the printhead 15 travel. The light source 20 is not particularly limited and may be a filament light source, a light emitting diode, or a laser. In some examples, the light source 20 may include various mirrors and optical lenses to focus light to travel in a narrow optical path across the drop path. In particular, the optical path from the light source 20 includes any path from the light source 20 to the detector 25. Although the present example illustrates a straight line optical path from the light source 20 to the detector 25, other examples may have different optical paths where the light source 20 and the detector 25 are positioned at different locations further away from the printhead 15. For example, various optical components such as mirrors and prisms may be used to design an optical path that crosses the drop path.

In the present example, the detector 25 is to detect an intensity of light that is received from the light source 20 after passing through the drop path and any other components, such as the coating 30. The manner by which the light intensity is measured is not particularly limited. For example, the detector 25 may include a photodiode to measure the intensity of light using the voltage across the photodiode. In other examples, the detector 25 may include a photoresistor or other type of light sensing component.

The coating 30 is to be disposed on the optical path between the drop path and the detector 25. Accordingly, the light from the light source 20 is to pass through the drop path first and then subsequently pass through the coating 30. In the present example, the coating 30 may be applied directly to a window of the detector 25 or directly on the photosensing element of the detector 25. In other examples, the coating 30 may be applied to a separate substrate placed on the optical path between the drop path and the detector 25. In further examples, the coating 30 may be substituted with the substrate having similar properties as the coating 30.

The properties of the coating 30 are to absorb substantially all of the light when the incident light intensity is below a threshold amount. Beyond the threshold amount, the coating 30 is to allow light to pass through the coating 30. For example, the coating 30 may exhibit a saturable absorption phenomenon where the absorption of light decreases with light intensity increases. The material from which the coating 30 is to be made is not particularly limited and may be any material having saturable absorption properties. In the present example, the coating 30 includes graphene. However, in other examples, the coating 30 may be made from other materials, such as a semiconductor compound such as GaAs, gold nanorods, carbon nanotubes, quantum dots and some metal ions.

It is to be appreciated that due to the relatively small amount of print fluid dispensed by the printhead 15, the change in the light intensity passing through the drop path may be relatively small. Therefore, ambient light fluctuations, changes to the optical path due to mechanical vibrations, thermal expansion, and others may generate system noise that may interfere with the accuracy of the measurement at the detector 25. In the present example, the coating 30 is calibrated to absorb a threshold amount of light to provide a substantially binary response at the detector 25 due to a change in the density of drops in the drop path. For example, the threshold of light to be absorbed by the coating 30 may be calibrated just above the intensity of the light passing through the drop path as a healthy nozzle of the printhead 15 is dispensing drops, but below the intensity of the light passing through the drop path when no drops are present. Accordingly, when a healthy nozzle of the printhead 15 is dispensing drops, the light from the light source 20 will be absorbed by the coating to provide substantially no signal at the detector 25. Once the drop density decreases below a specified amount, more light from the light source 20 will pass through the drop path and thus increase above the threshold amount of light of the coating 30. Accordingly, once the intensity of light reaching the coating 30 exceeds the threshold amount, light will begin passing through the coating 30 to the detector 25 to provide a substantially binary response.

In the present example, the coating 30 may exhibit the saturable absorption phenomenon within a specific band gap to absorb light having a specified energy (i.e. wavelength). By restricting the light to a specified wavelength, further improvements of the signal to noise ratio may be achieved. For example, the light source 20 may be a monochromatic light source and the detector 25 may include a filter such that the detector 25 is responsive to photons having a narrow range of energy. In addition, for some materials, such as graphene, the band gap in which the coating 30 will exhibit saturable absorption may be tuned to accommodate a wide range of light sources emitting photons with a specific energy. The manner by which the band gap of the coating 30 may be tuned is not particularly limited. For example, the band gap may be tuned by applying a voltage and adjusting the voltage across the coating. In other example, the band gap of the coating 30 may be adjusted by applying a magnetic field across the coating.

Figure 2:
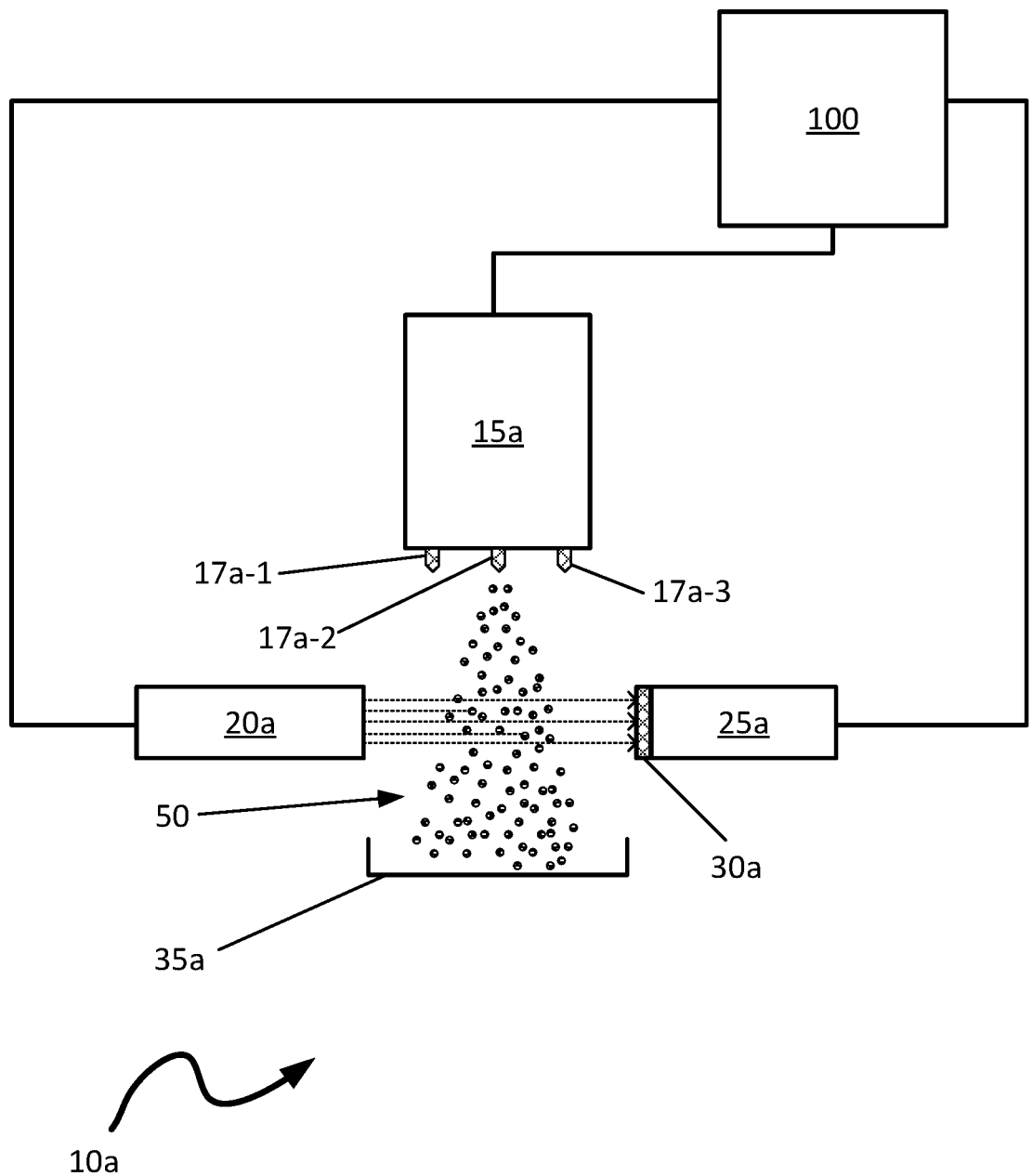
FIG. 2 is a schematic representation of another example apparatus to monitor the health of a nozzle.

Referring to FIG. 2, another apparatus to monitor the health of a nozzle is generally shown at 10a. Like components of the apparatus 10a bear like reference to their counterparts in the apparatus 10, except followed by the suffix "a". The apparatus 10a may be a part of the printing device or a separate component. In the present example, the apparatus 10a includes a moveable printhead 15a, a plurality of nozzles 17a-1, 17a-2, 17a-3 (generically, these nozzles are referred to herein as "nozzle 17a" and collectively they are referred to as "nozzles 17a", this nomenclature is used elsewhere in this description) a light source 20a, a detector 25a, a coating 30a, a receptacle 35a, and a controller 100.

The moveable printhead 15a is to house the nozzles 17a and to move from a position over a media, such as paper, to a position over the receptacle 35a where the health of the nozzles 17a may be monitored. The manner by which the moveable printhead 15a moves is not particularly limited. For example, the moveable printhead 15a may be moved along a rail using a motor. For example, the receptable 35a may be disposed at an edge of the printing device and the media may be moved relative to the moveable printhead 15a using rollers. Accordingly, the moveable printhead 15a may be moved to the edge of the printing device to monitor the health of a nozzle 17a between print jobs. In the present example, the receptable 35a is to receive print fluid during a test to determine the health of a nozzle 17a and subsequently discard the print fluid used in the test. The receptacle 35a may be any container or material that may receive waste print fluid. For example, the receptable may be a substrate, a textile, or a container.

The nozzles 17a are disposed on the moveable printhead 15a and are to dispense drops 50 of print fluid into the receptacle 35a when monitoring the health of the nozzles 17a. The manner by which the nozzles 17a dispense drops 50 is not limited. In the present example, the nozzles 17a may eject drops 50 of print fluid under pressure such that the drops 50 travel along a drop path, such as from the nozzle 17a-2 to the receptacle 35a through the air as shown in FIG. 2.

The light source 20a is to emit light across the drop path from the nozzles 17a. The light source 20a is not particularly limited and may be a filament light source, a light emitting diode, or a laser. In some examples, the light source 20a may include various mirrors and optical lenses to focus light to travel across the drop path.

In the present example, the detector 25a is to detect an intensity of light that is received from the light source 20a as the drops 50 travel between the light source 20a and the detector 25a. The manner by which the light intensity is measured is not particularly limited. For example, the detector 25a may include a photodiode to measure the intensity of light using the voltage across the photodiode. As illustrated, the light intensity from the light source 20a is reduced as the light passes through the drops 50. For example, the drops 50 may absorb some of the light from the light source 20a. In other examples, the drops 50 may also reflect some of the light from the light source 20a away from the detector.

The coating 30a is to be disposed on the detectors 25a facing the light source 20a. Accordingly, the light from the light source 20a is to pass through the drops 50 and then subsequently pass through the coating 30a prior to arriving at the photosensitive element of the detector 25a.

In the present example, the coating 30a is to absorb a threshold amount of light. After absorption of a threshold amount of light, the coating 30a is to allow light to pass through the coating 30a to the photosensitive element of the detector 25a. In the present example, the coating 30a has a uniform thickness across the detector 25a. In the present example, the threshold amount of light absorbed by the coating 30a may be dependent on the thickness of the coating 30a deposited on the detector 25a. Accordingly, the coating 30a may be calibrated by adjusting the thickness of the coating 30a.

Figure 3:
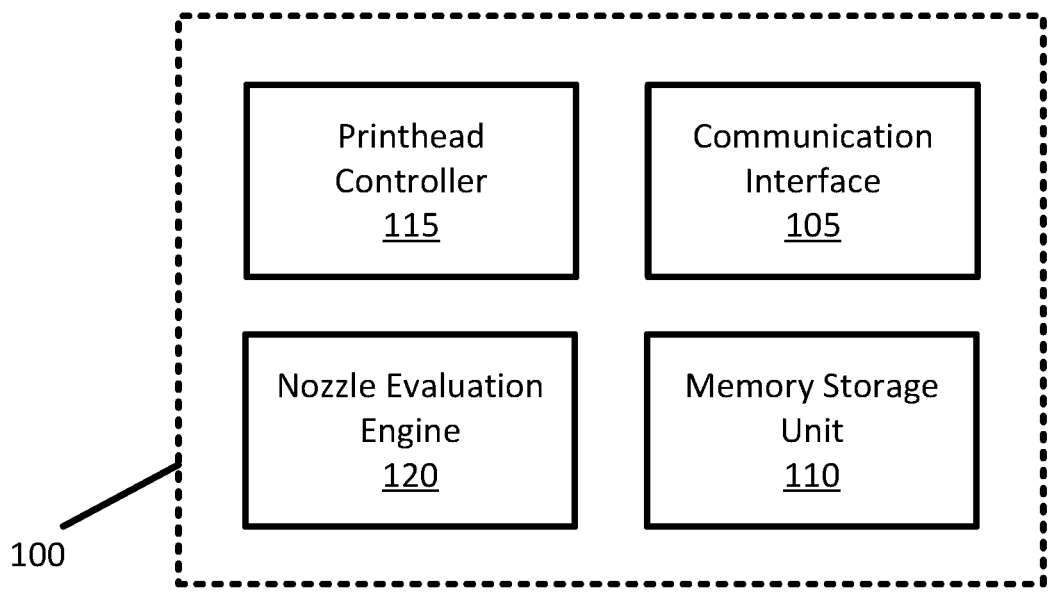
FIG. 3 is a schematic representation of the example controller of the apparatus shown in FIG. 2.

Referring to FIG. 3, the controller 100 is shown in more detail. In the present example, the controller 100 is in communication with the moveable printhead 15a, the light source 20a and the detector 25a. In other examples, the controller 100 may be in communication with fewer components, such as only the detector 25a to monitor the health of the nozzles 17a. In the present example, the controller 100 includes a communications interface 105, a memory storage unit 110, printhead controller 115, and a nozzle evaluation engine 120.

The communications interface 105 is to communicate with an external device to send and receive commands or other data. In the present example, the external device may be the printing device or another device to monitor the health of the nozzles 17a. In other examples, the communications interface 105 may communicate with a server to provide health data to the server, such as in examples where the printing device is managed remotely. The manner by which the communications interface 105 sends and receives data is not limited and may include sending and receiving an electrical signal via a wired connection. For example, the communications interface 105 may be connected to the printing device in examples where the apparatus 10a is part of the printing device, such as part of an onboard diagnosis system. In other examples, the communications interface 105 may send and receive wireless signals such as via a Bluetooth connection, radio signals or infrared signals from the scanning device. In further examples, the communications interface 105 may be a network interface for communicating over a local area network or the Internet where the communications interface 105 may communicate with a remote server.

The memory storage unit 110 may include a non-transitory machine-readable storage medium that may be any electronic, magnetic, optical, or other physical storage device. In the present example, the memory storage unit 110 may store an operating system that is executable to provide general functionality to the apparatus 10a, for example, to support various applications. Examples of operating systems include Windows™, macOS™, iOS™, Android™, Linux™, and Unix™. The memory storage unit 110 may additionally store instructions executable by the printhead controller 115 to operate the moveable printhead 15a, the light source 20a and the detector 25a as well as store hardware drivers to communicate with other components and other devices of the apparatus 10a, such as the communications interface 105 or various output and input devices (not shown).

In the present example, the memory storage unit 110 may also maintain a database to store health data of the nozzles 17a. In the present example, the memory storage unit 110 may receive a health data of a nozzle 17a from the nozzle evaluation engine 120 after processing data from the detector 25a. In this example, each nozzle 17a may be associated with an identifier and the nozzle evaluation engine 120 may assign a pass or fail for each nozzle 17a. The results may be stored on the memory storage unit 110 for retrieval by an administrator or for subsequent transmission via the communications interface 105 to an external device.

The printhead controller 115 is to control the moveable printhead 15a. In the present example, the printhead controller 115 may also control the light source 20a to time a light pulse with the dispensing of the drops 50 from the nozzle 17a-2. It is to be appreciated that in some examples, the light source 20a may be continuously powered on such that the printhead controller 115 does not need to communicate with the light source 20a. The printhead controller 115 may also be used to move the moveable printhead 15a within the printing device. For example, the printhead controller 115 may be used to position the moveable printhead 15a above the receptacle 35a. In other examples, the printhead controller 115 may be the same controller used to control the printhead during normal printing operations.

The nozzle evaluation engine 120 is to determine whether the health of a nozzle 17a is satisfactory. In the case that the health of the nozzle 17a meets a specified criteria, the nozzle evaluation engine 120 will pass the nozzle 17a and write the results to the memory storage unit 110. In the case that the health of the nozzle 17a fails to meet the specified criteria, the nozzle evaluation engine 120 may fail the nozzle 17a and write the results to the memory storage unit 110. In some examples, the failure of a nozzle 17a may also trigger additional actions. For example, if the moveable printhead 15a includes additional nozzles which may serve as a backup for the failed nozzle 17a, the nozzle evaluation engine 120 may direct the printhead controller 115 to start using the backup nozzle. In other examples, an error code at the printing device may be generated and/or all printing operations may be ceased until the nozzle 17a is repaired. In another example, a nozzle 17a is determined to be unhealthy, the printing device may execute servicing routines, such as cleaning or wiping the printhead 15a, or performing servicing spits of the nozzle 17a.

The manner by which the nozzle evaluation engine 120 makes the determination to pass or fails the nozzle 17*a* is not particularly limited. In the present example, the nozzle evaluation engine 120 may receive a signal from the detector 25*a* to indicate whether the measured light intensity is above or below a predetermined threshold. Since the coating 30*a* provides substantially no signal below a threshold, the threshold may be set at a relatively small amount of signal received. Accordingly, once the density of the drops 50 is too low, the detector 25*a* will measure a significant signal.

Figure 4A:
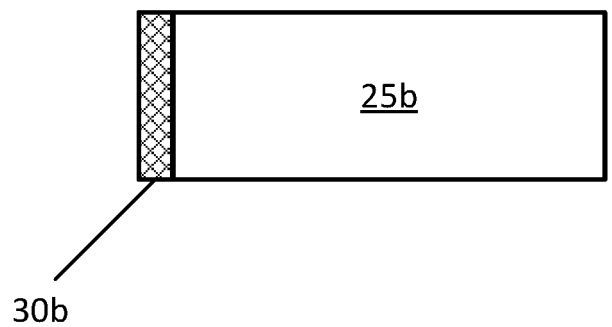
FIG. 4A is a schematic representation of a detector having a thin coating applied thereupon.
Figure 4B:
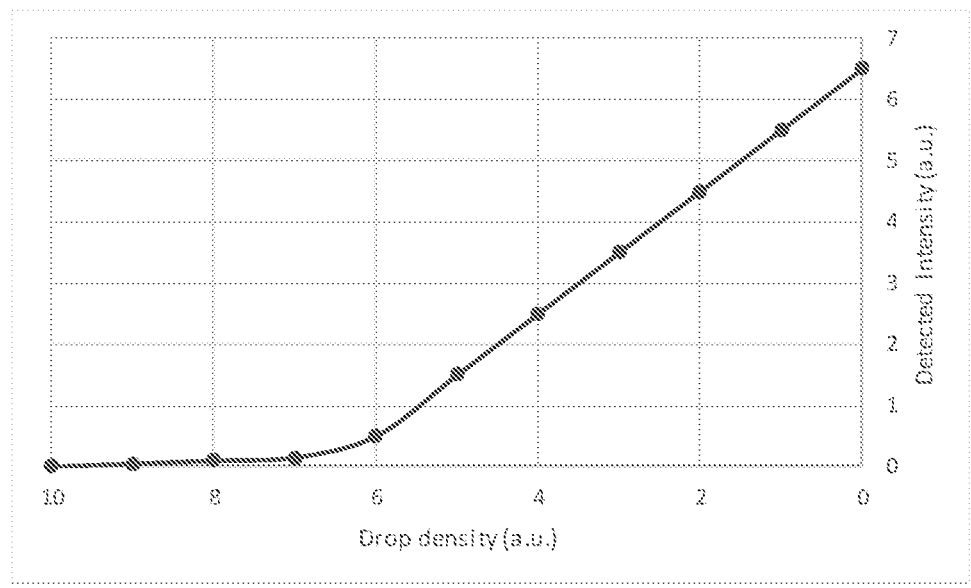
FIG. 4B is a response curing using arbitrary units of the detector shown in FIG. 4A.
Figure 5A:
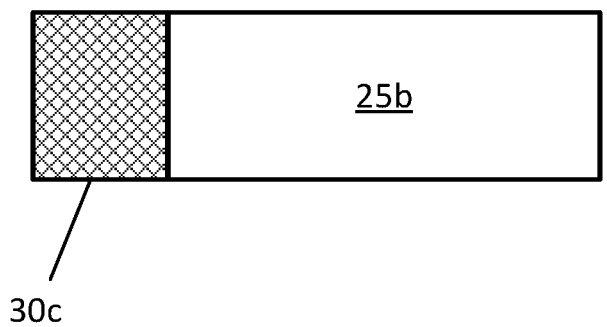
FIG. 5A is a schematic representation of a detector having a thick coating applied thereupon.
Figure 5B:
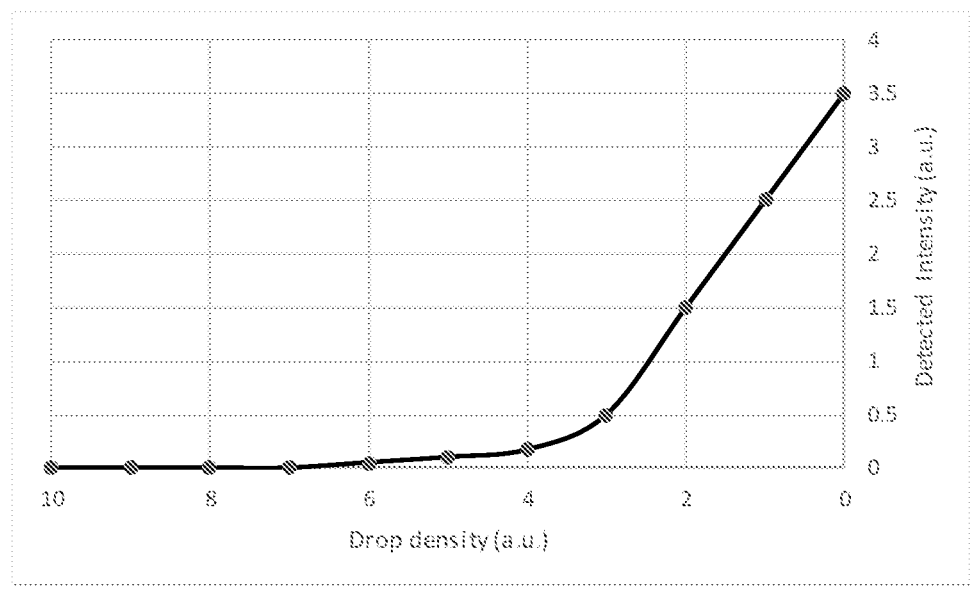
FIG. 5B is a response curing using arbitrary units of the detector shown in FIG. 5A.

Referring to FIGS. 4A-B and FIGS. 5A-B, the effects the response of a detector 25*b* between the coating 30*a* in FIG. 4A and the coating 30*b* in FIG. 5A is shown in FIG. 4B and FIG. 5B using the same arbitrary units in the figures, respectively. As illustrated, the coating 30*b* is thinner than the coating 30*c*. Accordingly, the threshold amount of light able to be absorbed by the coating 30*b* will be lower than the threshold amount of light able to be absorbed by the coating 30*c*. The knee of the response curve is shifted to the right as the coating 30*c* is able to absorb more photons than the coating 30*b*. Therefore, it is to be appreciated that the threshold drop density for which the nozzle 17*a* may be passed or fail may be calibrated by adjusting the thickness of the coating accordingly.

Figure 6:
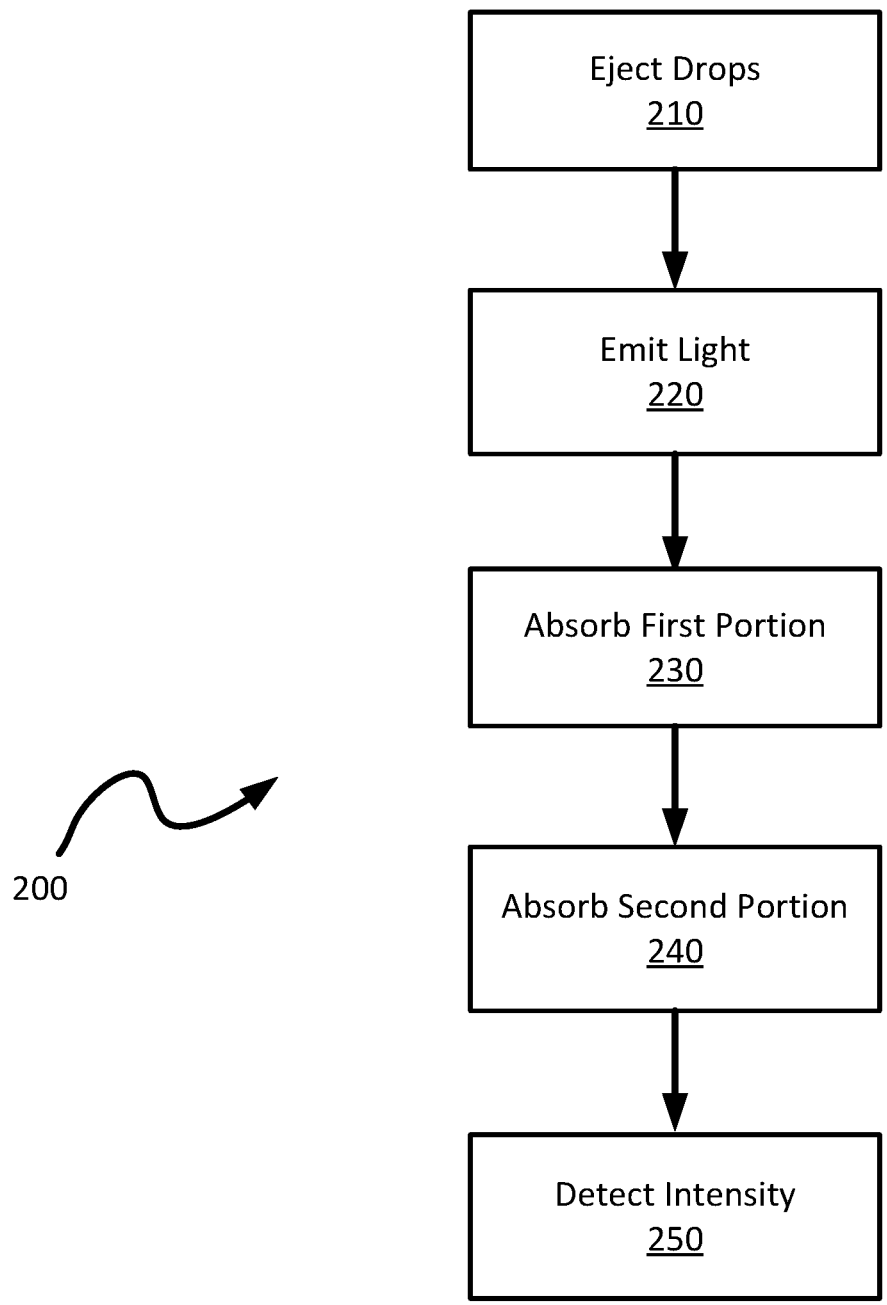
FIG. 6 is a flowchart of an example of a method of monitoring the health of a nozzle.

Referring to FIG. 6, a flowchart of a method of monitoring the health of a nozzle is shown at 200. In order to assist in the explanation of method 200, it will be assumed that method 200 may be performed with the apparatus 10*a*. Indeed, the method 200 may be one way in which apparatus 10*a* is used and the following discussion of method 200 may lead to a further understanding of the apparatus 10*a* along with its various components.

Beginning at block 210, the nozzle 17*a*-2 ejects drops 50 of print fluid that travel along a drop path toward a receptacle 35*a*. The manner by which the nozzle 17*a*-2 ejects the drops 50 is not particularly limited. In the present example, the moveable printhead 15*a* may control the nozzle 17*a*-2 and eject the drops 50 under pressure such that the drops 50 travel through the air to the receptacle 35*a*. The source of the print fluid provided to the nozzle 17*a*-2 is also not limited. For example, the nozzle 17*a*-2 may receive print fluid via the moveable printhead 15*a* from a tank, reservoir, or other print fluid source. To generate the pressure at the nozzle 17*a*-2, the moveable printhead 15*a* may use a thermal ink jet or a piezo ink jet mechanism to push the print fluid through the nozzle 17*a*-2. In other examples, a motor or pump may be used to pressurize the print fluid. In some examples, the moveable printhead 15*a* may receive print fluid from multiple sources where each source of print fluid may provide a different print fluid. For example, the moveable printhead 15*a* may have separate tanks of print fluid for different colors, such as cyan, magenta, and yellow. The print fluid from each source may be directed to the nozzle 17*a*-1, the nozzle 17*a*-2, and the nozzle 17*a*-3, respectively. Accordingly, during a printing operation, the moveable printhead 15*a* may dispense a mixture of different colors to deposit on the media to generate an output image. Accordingly, each of the nozzle 17*a*-1, the nozzle 17*a*-2, and the nozzle 17*a*-3 may be tested individually to determine their health.

Next, at block 220, the light source 20*a* emits light along an optical path that intersects the drop path of the drops 50 before entering the detector 25*a*. The manner by which the light travels from the light source 20*a* to the detector 25*a* is not limited and may involve optical components such as mirrors or prisms to change the direction of the light.

Block 230 involves absorbing a portion of the light as it travels through the drops 50 from the light source 20*a* to the detector 25*a*. The manner by which the light is absorbed is not particularly limited. In the present example, the print fluid may be opaque to the light from the light source 20*a*. Accordingly, as the light passes through the drops 50, the drops will absorb some of the light from the light source 20*a*. In general, the density of the drops 50 is relatively small such that the majority of the light may pass through when the nozzle 17*a* is healthy and ejecting the upper limit of drops to prove a high drop density. It is to be appreciated that when the nozzle 17*a* is not healthy, the drop density may be lower and more light from the light source 20*a* will pass through. Accordingly, the portion of light absorbed will be higher for a healthy nozzle 17*a* and lower for a nozzle 17*a* that is unhealthy.

Block 240 involves absorbing another portion of light using the coating 30*a*. In the present example, the coating 30*a* is capable of absorbing light below a threshold amount of light. Accordingly, if the amount of light incident on the coating 30*a* is below the threshold amount, the coating 30*a* will absorb substantially all of the remaining light such that substantially no light reaches the photosensitive element of the detector 25*a*. Therefore, the detector 25*a* will provide no signal to the controller 100, which indicates a healthy nozzle. Alternatively, if the amount of light incident on the coating 30*a* is above the threshold amount, the coating 30*a* will absorb a portion of photons incident on the coating 30*a* up to the threshold amount. The excess photons will then pass through the coating 30*a* to the photosensitive element of the detector 25*a*. Therefore, the detector 25*a* will provide a signal to the controller 100 to indicate that light was detected and that the nozzle 17*a* is unhealthy.

It is to be appreciated that in some examples, the threshold amount of light to be absorbed by the coating 30*a* may be adjusted to calibrate the coating 30*a*. For example, the thickness of the coating 30*a* may be varied by applying multiple layers. In the present example, where the coating 30*a* is graphene, the layers may be added to the coating 30*a* to absorb more photons. In addition, it is to be appreciated that the coating 30*a* may absorb photons having a specific energy within a specific band gap. In some examples, the band gap may be adjusted by applying a voltage across the coating 30*a* or applying a magnetic field to the coating 30*a*.

At block 250, the detector 25*a* is to detect the amount of light incident on a photosensitive element. The manner by which the light intensity is measured is not particularly limited. For example, the photosensitive element of the detector 25*a* may include a photodiode or photoresistor. In the present example, the response from the detector is to determine if there is measurable light on the photosensitive element to provide binary response. In other examples, the detector 25*a* may provide a measurement to the controller 100 instead of a binary pass or fail response.

It should be recognized that features and aspects of the various examples provided above may be combined into further examples that also fall within the scope of the present disclosure.

What is claimed is:

1. An apparatus comprising:
   a printhead to dispense drops of print fluid on a media, wherein the drops travel along a drop path through air from the printhead;
   a light source to emit light across the drop path;
   a detector to detect an intensity of the light received from the light source, wherein the drop path intersects an optical path from the light source to the detector; and a coating disposed on the optical path between the drop path and the detector, wherein the coating is to absorb a threshold amount of the light with a specified energy;
wherein the specified energy is tunable by a voltage applied across the coating, wherein the voltage adjusts a band gap of the coating.

2. The apparatus of claim 1, wherein the coating is applied to the detector directly.

3. The apparatus of claim 1, wherein the coating has a thickness across the optical path that is uniform.

4. The apparatus of claim 3, wherein the threshold amount of the light to be absorbed by the coating is determined by the thickness.

5. An apparatus comprising:
a printhead to dispense drops of print fluid on a media, wherein the drops travel along a drop path through air from the printhead;
a light source to emit light across the drop path;
a detector to detect an intensity of the light received from the light source, wherein the drop path intersects an optical path from the light source to the detector; and
a coating disposed on the optical path between the drop path and the detector, wherein the coating is to absorb a threshold amount of the light with a specified energy;
wherein the specified energy is tunable by a magnetic field applied across the coating,
wherein the magnetic field adjusts a band gap of the coating.

6. A method comprising:
ejecting drops of print fluid via a nozzle, wherein the drops travel along a drop path through air from the nozzle to a receptacle;
emitting light from a light source along an optical path to a detector, wherein across the optical path intersects the drop path;
absorbing a first portion of the light from the light source with the drops in the drop path;
absorbing a second portion of the light from the light source with a coating, wherein the second portion is limited to a threshold amount, wherein absorbing the second portion comprises absorbing photons with a specified energy that is tunable by a voltage applied across the coating, wherein the voltage adjusts a band gap of the coating; and
detecting an intensity of the light at the detector.

7. The method of claim 6, further comprising adjusting the threshold amount of light to be absorbed by the coating.

8. The method of claim 7, wherein adjusting the threshold amount comprises varying a thickness of the coating.

9. A method comprising:
ejecting drops of print fluid via a nozzle, wherein the drops travel along a drop path through air from the nozzle to a receptacle;
emitting light from a light source along an optical path to a detector, wherein across the optical path intersects the drop path;
absorbing a first portion of the light from the light source with the drops in the drop path;
absorbing a second portion of the light from the light source with a coating, wherein the second portion is limited to a threshold amount, wherein absorbing the second portion comprises absorbing photons with a specified energy that is tunable by a magnetic field applied across the coating, wherein the magnetic field adjusts a band gap of the coating; and
detecting an intensity of the light at the detector.

10. An apparatus comprising:
a receptacle for receiving print fluid;
a moveable printhead to move from a first position over a media to a second position over the receptacle;
a nozzle disposed on the moveable printhead to dispense drops of print fluid into the receptacle via a drop path;
a light source to emit light across the drop path;
a detector to detect an intensity of the light received from the light source as the drops travel between the light source and the detector; and
a coating disposed on the detector, wherein the coating is to absorb a threshold amount of the light with a specified energy, wherein the specified energy is tunable by a magnetic field applied across the coating, and wherein the magnetic field adjusts a band gap of the coating.

11. The apparatus of claim 10, wherein the coating has a uniform thickness, and wherein the threshold amount of the light to be absorbed by the coating is dependent on the uniform thickness.

* * * * *